United States Patent
Johnson et al.

(10) Patent No.: US 6,697,926 B2
(45) Date of Patent: Feb. 24, 2004

(54) METHOD AND APPARATUS FOR DETERMINING ACTUAL WRITE LATENCY AND ACCURATELY ALIGNING THE START OF DATA CAPTURE WITH THE ARRIVAL OF DATA AT A MEMORY DEVICE

(75) Inventors: Brian Johnson, Boise, ID (US); Brent Keeth, Boise, ID (US); Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 09/874,289

(22) Filed: Jun. 6, 2001

(65) Prior Publication Data

US 2002/0188816 A1 Dec. 12, 2002

(51) Int. Cl.$^7$ .............................................. G06F 12/00
(52) U.S. Cl. ........................ 711/167; 711/104; 711/105; 365/233; 365/233.5
(58) Field of Search ................................ 711/167, 104, 711/105; 365/233, 233.5

(56) References Cited

U.S. PATENT DOCUMENTS

| | | | | |
|---|---|---|---|---|
| 5,917,760 A | * | 6/1999 | Millar | 365/194 |
| 5,953,278 A | * | 9/1999 | McAdams et al. | 365/219 |
| 5,966,343 A | * | 10/1999 | Thurston | 365/233 |
| 6,003,118 A | | 12/1999 | Chen | |
| 6,029,250 A | | 2/2000 | Keeth | |
| 6,041,419 A | | 3/2000 | Huang et al. | |
| 6,067,606 A | | 5/2000 | Holscher et al. | |
| 6,078,546 A | | 6/2000 | Lee | |
| 6,101,612 A | * | 8/2000 | Jeddeloh | 713/401 |
| 6,128,748 A | | 10/2000 | MacWilliams et al. | |
| 6,260,154 B1 | * | 7/2001 | Jeddeloh | 713/401 |
| 6,272,070 B1 | * | 8/2001 | Keeth et al. | 365/233.5 |
| 6,330,683 B1 | * | 12/2001 | Jeddeloh | 713/401 |
| 6,445,643 B2 | * | 9/2002 | Keeth et al. | 365/233 |
| 2001/0012234 A1 | * | 8/2001 | Keeth et al. | 365/233.5 |

FOREIGN PATENT DOCUMENTS

| | | |
|---|---|---|
| EP | 0 855 653 A1 | 7/1998 |
| JP | 11-316706 | 11/1999 |

OTHER PUBLICATIONS

Blelloch et al., "Accounting for Memory Bank Contention and Delay in High–Bandwidth Multiprocessors," pp 84–94, ACM, 1995.*
Messerschmitt, "Synchronization in Digital System Design," pp1404–1419, IEEE, 1990.*
IBM Technical Disclosure Bulletin, "Variable Delay Digital Circuit," vol. 35, Iss. 4A, pp 365–366, Sep. 1, 1992.*

* cited by examiner

Primary Examiner—Matthew Kim
Assistant Examiner—Stephen Elmore
(74) Attorney, Agent, or Firm—Dickstein Shapiro Morin & Oshinsky LLP (57) ABSTRACT

A method and apparatus for accurately determining the actual arrival of data at a memory device relative to the write clock to accurately align the start of data capture and the arrival of the data at the memory device is disclosed. The actual time of arrival of data at the inputs to a memory device is determined by sending back-to-back write commands along with a predetermined data pattern to the memory device. The data pattern is stored in a register and any difference between the predicted arrival time of the data and the actual arrival time of the data is determined by logic circuitry. Any determined difference can then be compensated for by delaying the start of the capture of the data at the memory device, thereby accurately aligning the start of the data capture and the arrival of the data at the memory device.

74 Claims, 5 Drawing Sheets

METHOD AND APPARATUS FOR DETERMINING ACTUAL WRITE LATENCY AND ACCURATELY ALIGNING THE START OF DATA CAPTURE WITH THE ARRIVAL OF DATA AT A MEMORY DEVICE

BACKGROUND OF THE INVENTION

1. Field of the Invention

The present invention relates generally to high speed synchronous memory systems, and more particularly, to a method and apparatus for determining actual write latencies of memory devices and accurately aligning the start of data capture with the arrival of data at a memory device.

2. Description of the Related Art

In a typical computer system, a processor interfaces with a memory device over a bus, typically through a memory controller. When a controller submits a READ request to a memory device, the response from the memory device can be read by the controller from the bus after a delay of time, referred to as a READ "latency." If a controller submits a WRITE request, a memory device in the memory system can then receive the data from the bus and start to capture the data for storage after a certain write "latency."

The amount of latency can vary depending on the type of device. The amount of latency can also vary depending upon the type of request. For example, a memory device may require 10–15 nanoseconds to respond to a read request, but only 5–10 nanoseconds to respond to a write request.

A memory controller, in advance of issuing a memory request, typically stores a specified latency value for each type of request and for each type of device. Therefore, when issuing a request, the controller can determine the period of time that it must wait before providing data to or receiving data from the bus.

Figure 1:
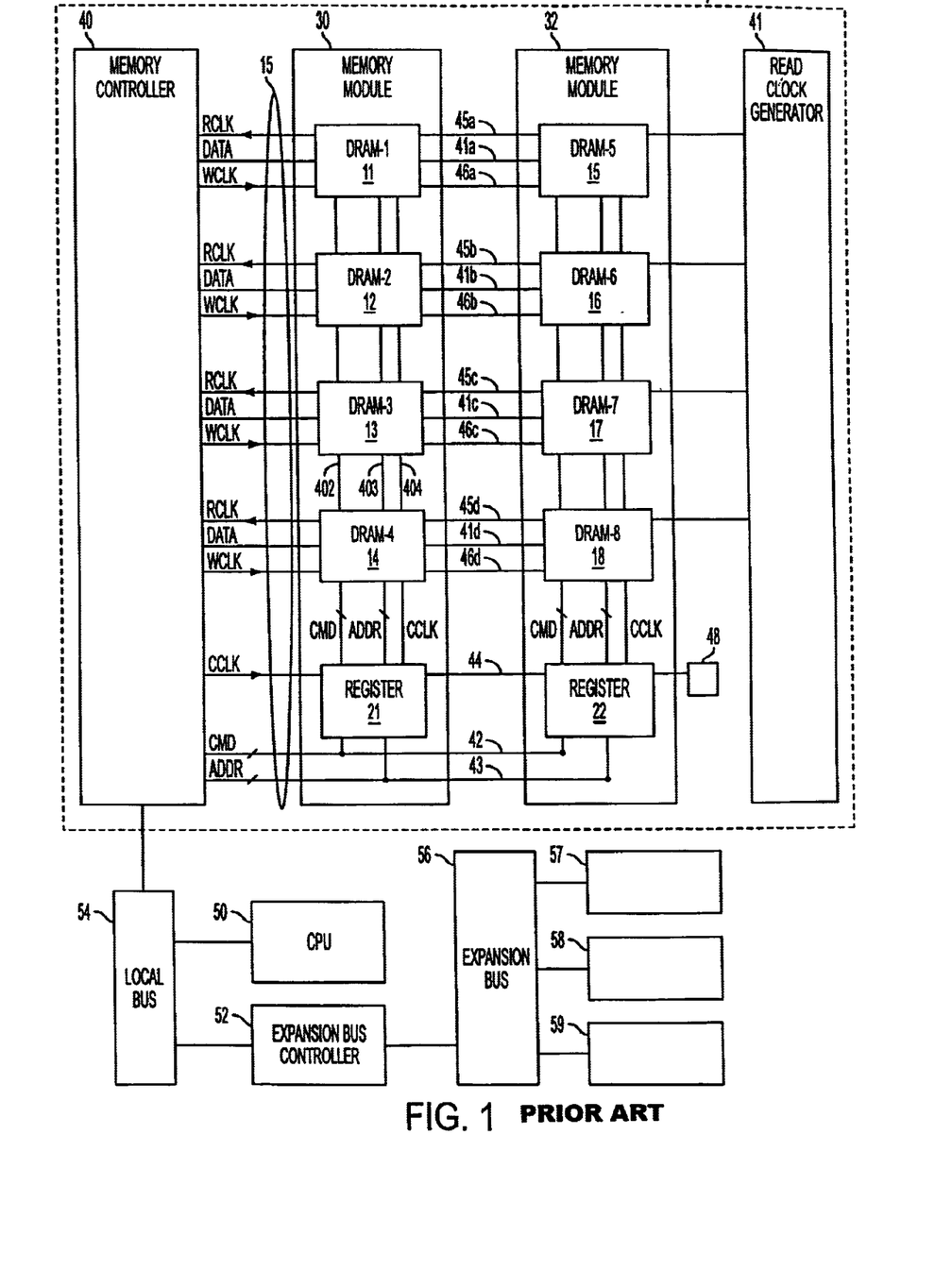
FIG. 1 illustrates in block diagram form a conventional computer system.

An exemplary computer system is illustrated in FIG. 1. The computer system includes a processor 50, a memory subsystem 10, and an expansion bus controller 52. The memory subsystem 10 and the expansion bus controller 52 are coupled to the processor 50 via a local bus 54. The expansion bus controller 52 is also coupled to at least one expansion bus 56, to which various peripheral devices 57–59 such as mass storage devices, keyboard, mouse, graphic adapters, and multimedia adapters may be attached.

The memory subsystem 10 includes a memory controller 40 which is coupled to a plurality of memory modules 30–32 via a plurality of signal lines 41a–41d, 42, 43,44, 45a–45d, 46a–46d. The plurality of data signal lines 41a–41d are used by the memory controller 40 and the memory modules 30, 32 to exchange DATA. Addresses ADDR are signaled over a plurality of address signal lines 43, while commands CMD are signaled over a plurality of command signal lines 42. The memory modules 30, 32 include a plurality of memory devices 11–14 and 15–18, respectively, and respective registers 21, 22. Each memory device 11–18 is a high speed synchronous memory device. Although only two memory modules 30, 32 and associated signal lines 41a–41d, 42, 43, 44, 45a–45d, 46a–46d are shown in FIG. 1, it should be noted that any number of memory modules can be used. In addition, although only four memory devices are shown per memory module, fewer or more memory devices can be provided on each module.

The plurality of signal lines 41a–41d, 42, 43, 44, 45a–45d, 46a–46d which couple the memory modules 30, 32 to the memory controller 40 are known as the memory bus 15. The memory bus 15 may have additional signal lines which are well known in the art, for example chip select lines, which are not illustrated for simplicity. Each column of memory devices 11–14, 15–18 which span the memory bus 15 is known as a rank of memory. Generally, single side memory modules, e.g. SIMMs (Single Sided In-Line Memory Modules) such as the ones illustrated in FIG. 1, contain a single rank of memory. However, double sided memory modules, e.g. DIMMs (Dual In-Line Memory Modules) containing two ranks of memory may also be employed.

A plurality of data signal lines 41a–41d couple the memory devices 11–18 to the memory controller 40. Read data is output serially synchronized to a read clock signal RCLK, which is driven across a plurality of read clock signal lines 45a–45d. The read clock signal RCLK is generated by a read clock generator 41 which is applied to the memory devices 11–18 of the memory modules 32, 30, and to the memory controller 40.

Although shown as separate from the memory modules 30, 32 for illustrative purposes, the read clock generator 41 is often provided within the memory devices 11–18 themselves and the read clock signals may be derived from other clock signals applied to the memory devices.

Write data is input serially synchronized to the write clock signal WCLK, which is driven across a plurality of write clock signal lines 46a–46d by the memory controller 40. Commands and addresses are clocked using a command clock signal CCLK which is driven by the memory controller across the registers 21, 22 of the memory modules 30, 32, to a terminator 48. The command, address, and command clock signal lines 42–44 are directly coupled to the registers 21, 22 of the memory modules 30, 32. The registers 21, 22 buffer these signals before they are distributed to the memory devices 11–18 of the memory modules 30, 32. The memory subsystem 10 therefore operates under a three clock domain, i.e., a read clock domain governed by the read clock RCLK, a write clock domain governed by the write clock WCLK, and a command clock domain governed by the command clock CCLK. In a two clock domain, the third clock domain CCLK does not exist and the write clock WCLK serves the dual purpose of write data capture and command/address capture.

When a memory device 11–18 accepts a read command, a data associated with that read command is not output on the memory bus 15 until a certain amount of time has elapsed as determined by the command clock CCLK. This time is known as device read latency CL. A memory device 11–18 can often be programmed to operate at any one of a plurality of device read latencies, ranging from a minimum device read latency (which varies from device to device) to a maximum read latency.

Thus, the read latency CL of each device is measured relative to the command clock (CCLK) in a three clock domain as described above, or the write clock WCLK in a two clock domain as described above, since in the two clock domain the write clock WCLK serves the dual purpose of write data capture and command/address capture. Current specifications for a two clock domain require a write latency of CL-1, i.e., one clock cycle less than the read latency, or CL-2, i.e., two clock cycles less than the read latency. However, because the read clock signal RCLK is typically compensated for by a delay locked-loop circuit with an output model of the system, the true read latency CL relative to the write clock WCLK is unknown. Therefore, specifying the write latency relative to the read latency may not accurately predict the arrival of data at the device relative to the write clock.

In addition, the write latency of each device is only one portion of the write latency seen by the memory controller 40. This total latency seen by the memory controller, known as system latency, is the sum of the device write latency and the latency caused by the effect of signal propagation time between the memory devices 11–18 and the memory controller 40. If the signal propagation between each memory device 11–18 and the memory controller 40 were identical, the latency induced by the signal propagation time would be constant and equally affect each memory device 11–18. However, as FIG. 1 illustrates, commands CMD, addresses ADDR, and the command clock CCLK are initially routed to registers 21, 22 before they are distributed to the memory devices 11–18. Each memory device 11–14, 15–18 on a memory module 30, 32 is located at a different distance from the register 21, 22. Thus each memory device 11–14 will receive a command and/or data issued by the memory controller 40 at different times. Additionally, there are also differences in distance between the memory controller 40 and the registers 21, 22 of the two memory modules 30, 32. Register 21 (on memory module 30) is closer to the memory controller 40 and will therefore receive commands, addresses, and the command clock before register 22 (on memory module 32). Thus, every memory device 11–18 of the memory subsystem 10 has a different signal path length to the memory controller for its command CMD, address ADDR, and command clock CCLK signals and will receive commands and/or data issued by the memory controller at varying times.

Due to differences in each memory device's 11–18 minimum device write latency and differences in their command CMD, address ADDR, and command clock CCLK signal propagation, each memory device 11–18 may have a different system latency. This further prevents accurate predictions in discrete clock cycles as to when data will arrive at a particular memory device 11–18 relative to the write clock WCLK.

Thus, there exists a need for a method and apparatus for accurately determining the actual write latency, i.e., arrival of data, at a memory device relative to the write clock and aligning the start of the data capture with the arrival of the data associated with a write command.

SUMMARY OF THE INVENTION

The present invention provides a method and apparatus for accurately determining the arrival of data at a memory device and aligning the start of the data capture with the arrival of the data associated with a write command.

In accordance with the present invention, the actual time of arrival of data at the inputs to a memory device is determined during a calibration period by sending back-to-back write commands along with a predetermined data pattern to the memory device. The data pattern is stored in a register and any difference between the predicted arrival time of the data and the actual arrival time of the data is determined by logic circuitry. Any determined difference can then be compensated for by utilizing a counter to delay the start of the capture of the data at the memory device from the receipt of a write command, thereby accurately aligning the start of the data capture and the arrival of the data at the memory device.

These and other advantages and features of the invention will become more readily apparent from the following detailed description of the invention which is provided in connection with the accompanying drawings.

DETAILED DESCRIPTION OF THE PREFERRED EMBODIMENTS

The present invention will be described as set forth in the exemplary embodiments illustrated in FIGS. 2–5. Other embodiments may be utilized and structural or logical changes may be made without departing from the spirit or scope of the present invention. Like items are referred to by like reference numerals.

In accordance with the present invention, the actual time of arrival of data at the inputs to a memory device is determined and any determined difference between the predicted arrival time and actual arrival time can then be compensated for by delaying the start of the capture of the data at the memory device, thereby accurately aligning the start of the data capture and the arrival of the data at the memory device.

Figure 2:
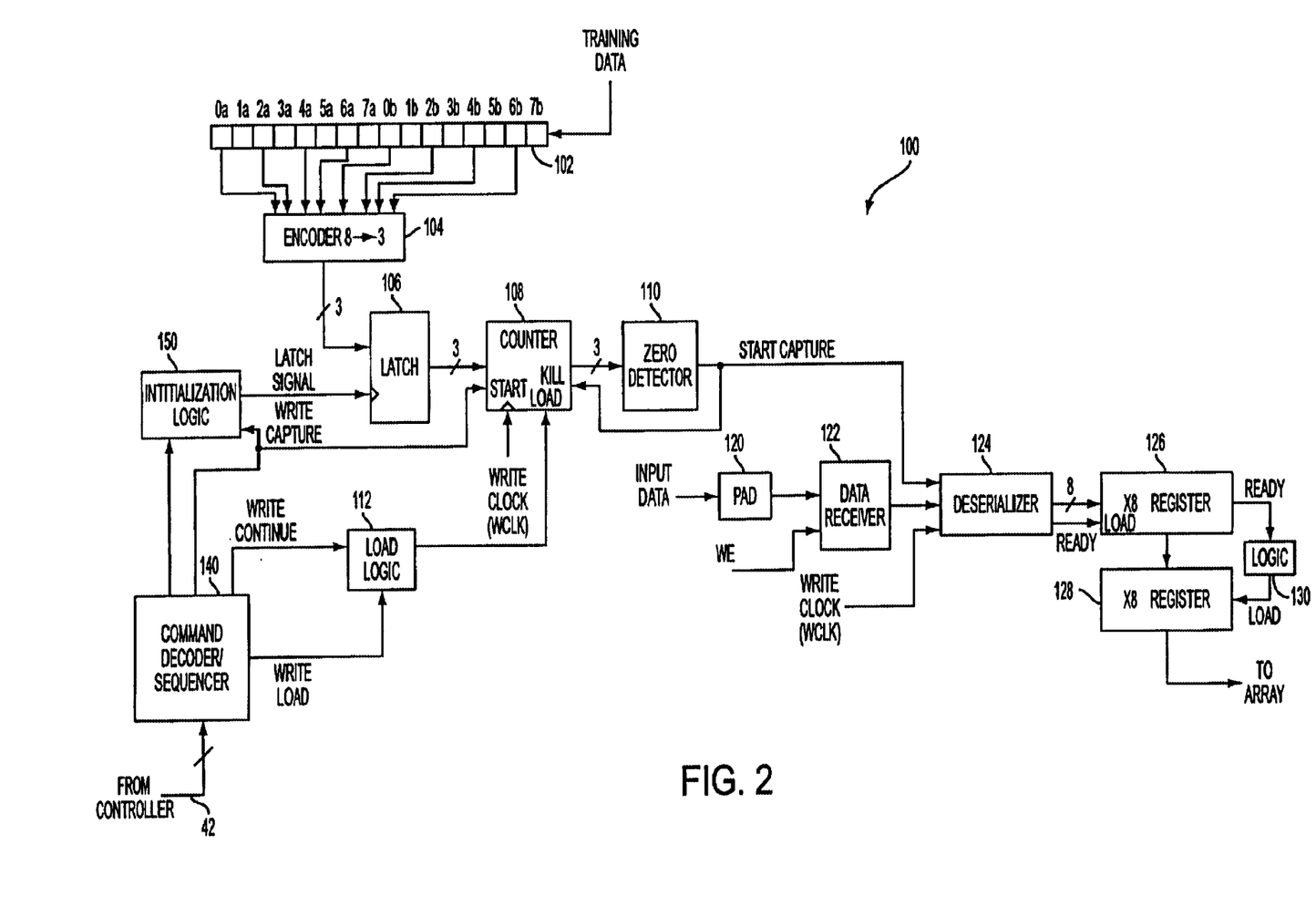
FIG. 2 illustrates in block diagram form a circuit for determining the actual write latency and aligning the arrival of a write command and data at a memory device according to the present invention.

FIG. 2 illustrates in block diagram form a circuit 100 for determining the actual arrival time of data and aligning the start of the data capture with the arrival of data at a memory device according to the present invention. Circuit 100 would be provided within each memory device 11–18 of FIG. 1.

Although only one circuit 100 is shown in FIG. 2, it should be understood that a plurality of circuits 100 may be used at each memory device 11–18 to assist in data capture using a plurality of data paths of a multi-bit data bus. Alternatively, certain portions of the circuit 100 may be duplicated at each memory device 11–18, and certain other portions of the circuit 100 may be shared among the plurality of data paths, in order to conserve area on the integrated circuit die.

Circuit 100 includes a register 102 that is used to determine the actual arrival time of data from the memory controller 40. Register 102, as illustrated in FIG. 2, is a 16 bit register. The memory controller 40 will send a command signal via CMD line 42 to one or more of the DRAMs 11–18 to indicate that the DRAMs 11–18 are to enter a calibration (training) mode. The controller 40 will then send back-to-back WRITE commands to the DRAMs 11–18 that are in the calibration mode. The controller 40 will then send data associated with the back-to-back WRITE commands at the specified write latency for the type of request and type of device, such as for example CL-1 or CL-2, as previously described, and the DRAM 11–18 will start data capture at an input pad 120 and data capture latch 122, as requested by the WRITE command signal.

As noted above, however, the specified write latency may not accurately predict the actual arrival of the data at the DRAM 11–18, and thus the data capture by the DRAM 11–18 may not start at the same time as the arrival of the data. To determine the difference between the time of the start of the data capture by the DRAM 11–18 and the receipt of the data associated with the write command according to the present invention, the data associated with the back-to-back write commands is a predetermined training data pattern. Preferably, the training data is a pair of 8-bit words, i.e., 16 bits, in which the first bit is a "0" and all subsequent bits are a "1." It should be noted that the use of a pair of data words is preferable to provide a greater number of bits with which to determine when the data actually arrives at the DRAM 11–18, since the maximum specified latency for DRAMs 11–18 is typically up to eight clock cycles, thus requiring a two-byte training data pattern as will be further described below.

Figure 3A:
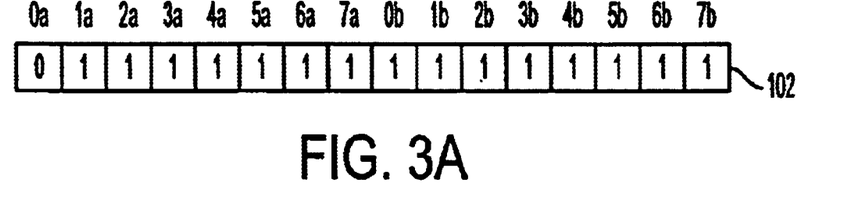
FIGS. 3A–3D illustrate a data register from the circuit of FIG. 2 according to the present invention.

The training data from the controller 40 arrives at an input pad 120 and is latched in a data capture latch 122. The training data is passed through a deserializer 124 and x8 registers 126, 128, and stored in register 102. If the start of the data capture in the DRAM 11–18 (e.g., in the data capture latch 122 and the deserializer 124) and the arrival of the training data are accurately aligned, the first data bit of the training data, i.e., the bit having a "0" value, will be stored in the first location, i.e., the location 0a, of register 102 as illustrated in FIG. 3A. Accordingly, since the start of the data capture and the arrival of the data are accurately aligned, it would not be necessary to adjust the start of the data capture.

If, however, the start of the data capture and the arrival of the training data are not accurately aligned, the first data bit, i.e., the bit having a "0" value, will not be stored in the first location of register 102 but will instead be stored in a subsequent location. It should be understood that the data is sent synchronously with each rising and falling edge of the clock signal WCLK, and the data capture will only start on a rising edge of the clock signal. Accordingly, the first data bit of the training data will only be stored in a location that corresponds to a rising edge of the clock signal. Thus, the first bit of data will be stored only in an even location of register 102, i.e., location 0a, 2a, 4a, 6a, 0b, 2b, 4b or 6b.

Figure 3B:
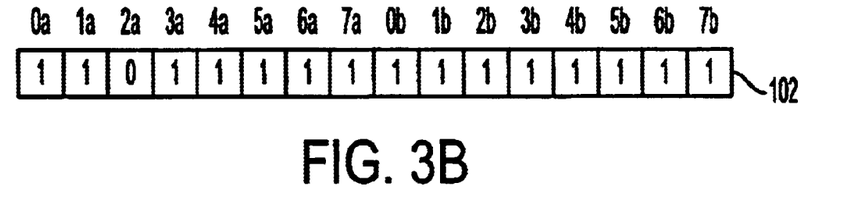
Figure 3C:
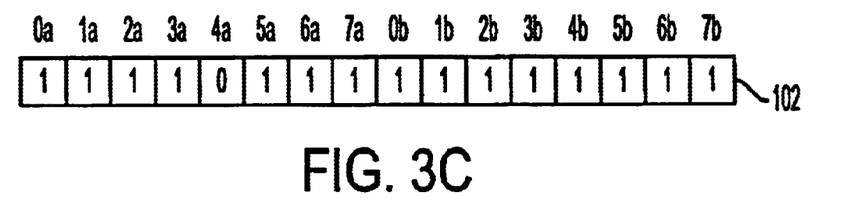
Figure 3D:
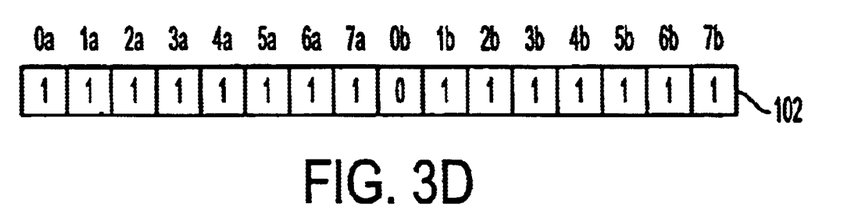

For example, if the data arrives one clock cycle later than the specified write latency, the first data bit will be stored in location 2a of register 102 as illustrated in FIG. 3B. If the data arrives two clock cycles later than the specified write latency, the first data bit will be stored in location 4a of register 102 as illustrated in FIG. 3C. If the data arrives four clock cycles later than the specified write latency, the first data bit will be stored in location 0b of register 102 as illustrated in FIG. 3D. It should be understood that in those instances where the data is arriving later than expected, such as for example in FIGS. 3B, 3C and 3D, the data that will be stored in the register locations prior to the actual receipt of the training data, i.e., locations 0a, 1a in FIG. 3B, locations 0a, 1a, 2a and 3a in FIG. 3C, and locations 0a, 1a, 2a, 3a, 4a, 5a, 6a and 7a in FIG. 3D will have a value of "1," since the data drivers are pull-down only, i.e., a "1" value is present unless the controller activates the data drivers to pull-down the value to a "0." Accordingly, if no data is present, the value stored in the register 102 will default to a "1" value. Alternatively, the controller could drive data having a value of "1" until the start of the training data to ensure the values stored in the register before the first bit of the training data is received have a "1" value.

Once the training data has been input to register 102, the data associated with each rising edge of the clock, i.e., the data stored in the even locations of register 102 (locations 0a, 2a, 4a, 6a, 0b, 2b, 4b and 6b) is input to an encoder 104. Only the data from the even locations of register 102 is necessary since the first bit of the training data will always occur on a rising edge of the clock signal, and therefore be located in an even location. Encoder 104 will encode the 8-bit input, i.e., the even locations of register 102, into a three digit binary number based upon the location of register 102 in which the first bit of the training data (value "0") is stored. This location represents the number of clock cycles that the capture of the data should be delayed to properly synchronize with the arrival of the data.

For example, if the start of the data capture and the arrival of the data are accurately aligned as illustrated in FIG. 3A, the input to encoder 104 from register 102 will be 01111111, indicating the first bit of the training data is stored in location 0a of register 102. Encoder 104 will output the binary number 000, which represents the location 0a of register 102 and indicates the start of the data capture and the arrival of the data occurred on the same clock cycle. If the start of the data capture is one clock cycle too early as illustrated in FIG. 3B, the input to encoder 104 will be 10111111. Encoder 104 will output the binary number 001, which represents the location 2a of register 102 and indicates the start of the data capture occurred one clock cycle too early. If the start of the data capture is two clock cycles too early as illustrated in FIG. 3C, the input to encoder 104 will be 11011111. Encoder 104 will output the binary number 010, which represents the location 4a of register 102 and indicates the start of the data capture occurred two clock cycles too early. If the start of the data capture is four clock cycles too early as illustrated in FIG. 3D, the input to encoder 104 will be 11110111. Encoder 104 will output the binary number 100, which represents the location 0b of register 102 and indicates the start of the data capture occurred four clock cycles too early.

At an appropriate time after the training data has been received in register 102 and encoded in encoder 104, the initialization logic 150 will output a latch signal to the latch 106. The latch 106 will latch the output of the encoder 104 in the form of the three digit binary number output from encoder 104. As noted above, the output from encoder 104 indicates the number of clock cycles too early that the data capture started before the data actually arrived. When latch 106 receives a latch signal, it latches the stored value from encoder 104 for use in the counters 108a, 108b. Each counter 108a, 108b is a down-counter which uses the value from latch 106 as a starting point, counts down to zero, and resets to a non-zero value (e.g., binary "111" or decimal "7").

As shown in FIG. 2, two counters 108a, 108b may be used to permit back-to-back write commands to be received and properly timed to the correct latency. As noted, two counters 108a, 108b may be required because the maximum specified latency for DRAMs 11–18 may be typically up to eight clock cycles, and for a WRITE burst length of eight bits (4 clock cycles), proper timing of back-to-back WRITE operations may require overlapping countdowns and thus two independent counters.

The toggle circuit 114 alternately selects a first counter, e.g., counter 108a, and then a second counter, e.g., counter 108b, each time it receives a write capture signal from controller 40 via the command decoder/sequencer 140. The first and second counters 108a, 108b are connected to first and second outputs of a start/load logic circuit 116 that, using the output of toggle circuit 114, selects which of the counters 108a, 108b receives the next start/load signal to begin counting down. When a counter 108a, 108b receives a start/load signal, it begins counting down toward zero, in synchrony with the write clock WCLK, starting from the value supplied by latch 106. After reaching zero, each counter 108a, 108b resets to its non-zero value (e.g., binary "111" or decimal "7"). Each counter 108a, 108b stops counting upon reaching the value 7 (111) or upon receiving another start/load signal.

The output of each counter 108a, 108b is input to a respective zero detector 110a, 110a. The outputs of the zero detectors 110a, 110a are coupled to at least one OR gate 112, which outputs a Start Capture signal when the value of either one of the counters 108a, 108b reaches zero. The Start Capture signal is received by the deserializer 124, at which time the deserializer 124 begins capturing data received from the data capture latch 122.

Although two counters 108a, 108b are illustrated in FIG. 2, it should be understood that this is not required and any number of counters, for example a single counter, may be used in accordance with the invention.

Calibration typically is complete after one two-byte training pattern is received at the DRAM 11–18. Further calibration may result in an incorrect value stored in latch 106. However, redundant calibration operations may be performed if desired, so long as the value stored in latch 106 is reset to zero ("0") prior to each calibration operation.

Once the training mode is complete, i.e., the latch 106 has stored a value for the start of counters 108a, 108b, then the circuit 100 can accurately align the start of the data capture and the arrival of the input data at the memory device. Thus, for example, if the start of the data capture is one clock cycle too early as illustrated in FIG. 3B, the value input to counters 108a, 108b from latch 106 will be 001. This value will be the starting point for counters 108a, 108b to count down from until each reaches zero. For the example illustrated in FIG. 3B, one clock cycle after a counter 108a, 108b is activated, the count will reach zero, and a respective zero detector 110a, 110b will output a zero detect signal to the OR gate 112, which will issue a Start Capture signal. Thus, the start of the data capture will be delayed by one WCLK clock cycle and therefore be accurately aligned with the actual arrival of the input data. If the start of the data capture is properly aligned with the arrival of the input data as illustrated in FIG. 3A, the value input to counters 108a, 108b from latch 106 will be 000, and thus the start of the data capture will not be delayed since it is already accurately aligned with the actual arrival of the input data.

The input of data to a memory device 11–18 after the training mode has been completed is as follows. Suppose for example data is to be input to DRAM 12, which during the training mode determined the start of the data capture occurred one cycle too early as illustrated in FIG. 3B. Accordingly, the value stored in latch 106 for DRAM 12 would be 001. Controller 40 will issue a write command and then send the associated input data after the specified write latency for DRAM 12. The command decoder/sequencer 140 will send a Write Capture signal to the toggle circuit 114, start/load logic circuit 116 and initialization logic circuit 150. Initialization logic circuit 150 is used to control the latch signal sent to latch 106 and toggle circuit 114. Initialization logic circuit 150 will determine when 16 bits of data have been received relative to the Write Capture signal being asserted and then send a latch signal to latch 106 and the toggle circuit 114. The determination by initialization logic 150 can be done for example with a 3-bit counter that counts clock cycles. Latch 106 will output the stored value to the counters 108a, 108b, which in response to start/load signals alternately asserted by the start/load logic circuit 116, will start counting down from the value received from latch 106.

Each of the counters 108a, 108b is provided with a Start/Load input which receives a start/load signal from start/load logic 116. The signal input to the Start/Load input of each counter 108a, 108b is determined based on the output of the toggle circuit 114, which selects between the counters 108a, 108b to permit the correct timing of back-to-back write commands received by command decoder/sequencer 140. If back-to-back write commands are received during data input, a first counter, e.g., counter 108a, counts down to synchronize the first write command, and a second counter, e.g., counter 108b, counts down to synchronize the second write command. Accordingly, controller 40 may issue a write command spaced one burst length from the previous write command, causing the zero detect circuits 110a, 110b to fire at a minimum time spacing of the data burst length (e.g., 8 ticks or 4 clock cycles). The zero detect circuits 110a, 110a are coupled through an OR gate 112 to detect when one of the zero detect circuits 110a, 110a goes high. Each of the zero detect circuits 110a, 110a remains high for one clock cycle only after firing, because, as noted, the output of the counters 108a, 108b, is either reset or stops counting at the value 7 (binary 111).

The input data associated with the write command is sent to a pad 120 of DRAM 12 which sends the input data to a data capture latch 122. As noted in the example above, the receipt of the input data may lag the start of the data capture by one clock cycle. The data capture latch 122 will drive the input data DATA QP to deserializer 124, which will be enabled upon receipt of the Start Capture signal from the OR gate 112. Thus, in the present example the deserializer 124 will not be enabled until after one clock cycle has passed with respect to when the data was supposed to have arrived and thus be accurately aligned with the actual receipt of the input data. Deserializer 124 deserializes the input data DATA QP into 8-bit words and provides an 8-bit word to a first x8 register 126, which provides the input data to a second x8 register 128. The second x8 register 128 is provided to allow the DRAM 12 to capture two 8-bit words back-to-back. The input data is then sent to an array of DRAM 12, and/or to the register 102 when in the training mode, as noted.

Figure 4:
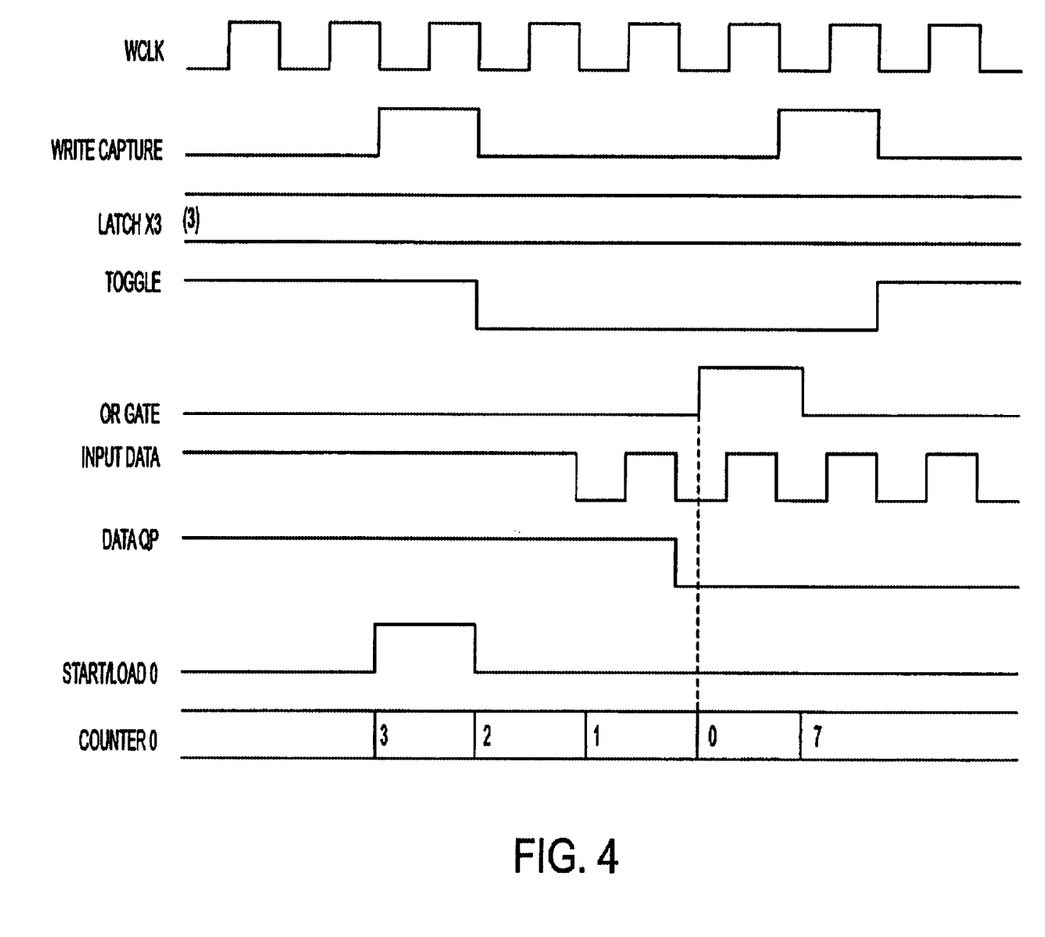
FIG. 4 illustrates a timing diagram of selected signals from the circuit of FIG. 2 according to the present invention.
Figure 5:
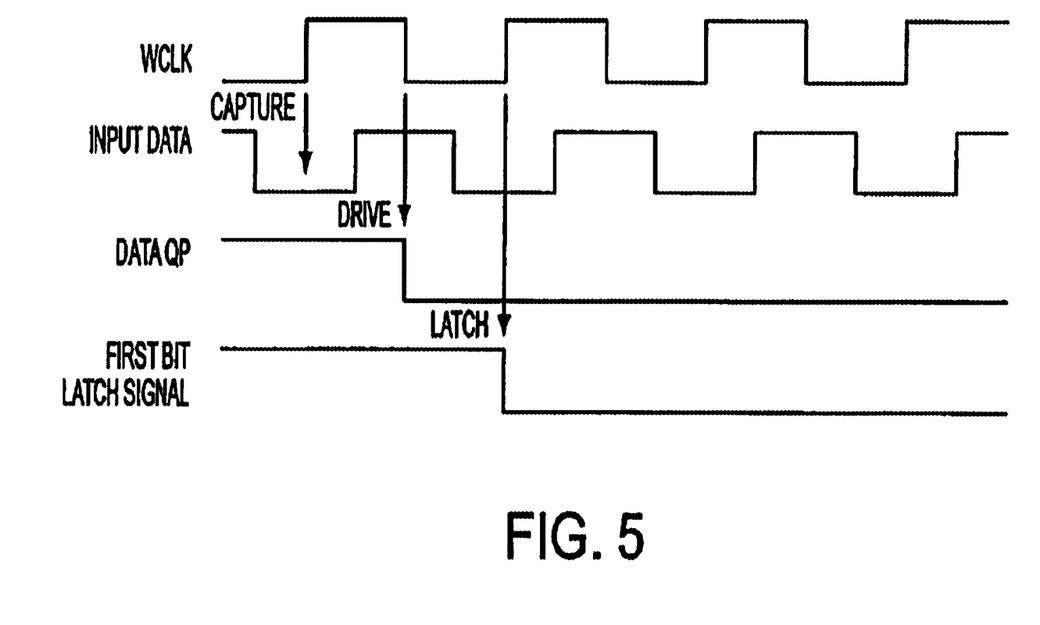
FIG. 5 illustrates another timing diagram of selected signals from the circuit of FIG. 2 according to the present invention.

FIGS. 4 and 5 show exemplary timing diagrams for an example in which the start of data capture has been determined to be three clock cycles too early. Referring to FIG. 4, the output of latch 106 (LATCHX3) having been previously determined to be three (binary 011), the selected counter (COUNTER0) begins counting down from three toward zero in synchrony with the write clock (WCLK), when the start/load signal (START/LOAD0) goes high. The start/load signal (START/LOAD0) goes high for the selected counter when the WRITE CAPTURE signal goes high, which also causes the TOGGLE signal to switch states. As shown in FIG. 4, the TOGGLE signal switches from high to low or low to high at each occurrence of the falling edge of the WRITE CAPTURE signal.

When the output of the selected counter (COUNTER0) reaches zero, it causes the output signal of the OR gate 112 (OR GATE) to go high for one clock cycle. As illustrated by the dotted line in FIG. 4, when the output of the OR gate 112 (OR GATE) goes high, the deserializer 124 begins capturing input data from the data capture latch 122. Because the output of the OR gate 112 (OR GATE) is delayed (e.g., three) clock cycles from receipt of the write capture signal (WRITE CAPTURE), the start of data capture at the deserializer 124 may be advantageously aligned with the arrival of the correct input data at the memory device (e.g., DRAM 12).

Referring to FIG. 5, the input data (INPUT DATA) is captured on the rising edge of the write clock (WCLK) at the data capture latch 122, but is driven on the output (DATA QP) of the data capture latch 122 on the falling edge of the write clock (WCLK). The first data bit in the deserializer 124 is captured on the next rising edge of the write clock (WCLK) or the rising edge of the output signal of the OR gate 112 (OR GATE in FIG. 4), whichever occurs last. In this way, the deserializer 124 begins capturing the input data when both the write clock (WCLK) and the output signal of the OR gate 112 is high.

Thus, according to the present invention, the difference between the specified write latency and the actual time of arrival of input data at the inputs to a memory device is determined. Any determined difference is then compensated for by utilizing a counter to delay the start of the capture of the data at the memory device, thereby accurately aligning the start of the data capture and the arrival of the data at the memory device.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A circuit for determining write latency of a memory device comprising:
    a register having a plurality of locations, said register receiving and storing at least a portion of a predetermined data pattern;
    an encoder coupled to said register, said encoder having an input coupled to receive data stored in at least a portion of said plurality of locations, said encoder providing an output representing a difference between an actual receipt time of said predetermined data pattern and an expected receipt time of said predetermined data pattern.

2. The circuit according to claim 1, wherein said register has sixteen locations.

3. The circuit according to claim 2, wherein said portion of said plurality of locations includes eight locations.

4. The circuit according to claim 3, wherein said eight locations are even locations of said register.

5. The circuit according to claim 3, wherein said eight locations are odd locations of said register.

6. The circuit according to claim 3, wherein said encoder encodes data stored in said eight locations into a number, said number representing a location of said plurality of locations where a first bit of said predetermined data pattern is stored, said location where said first bit of said predetermined data is stored representing said difference with respect to said clock signal between said actual receipt time of said predetermined data pattern and said expected receipt time of said predetermined data pattern.

7. The circuit according to claim 6, wherein said number is a binary number.

8. The circuit according to claim 6, further comprising:
    a latch coupled to said encoder to receive and store said number.

9. The circuit according to claim 1, wherein said predetermined data pattern is sixteen bits long.

10. The circuit according to claim 9, wherein said predetermined data pattern includes a first bit having a first value and all remaining bits having a second value.

11. The circuit according to claim 1, wherein said difference between said actual receipt time of said predetermined data pattern and said expected receipt time of said predetermined data pattern is measured by cycles of a clock signal.

12. A circuit for aligning a start time for capture of input data with actual receipt of said input data comprising:
    a first circuit to determine a time difference between an actual arrival time of said input data and an expected arrival time of said input data;
    a delay circuit coupled to said first circuit, said delay circuit delaying said start time for capture of said input data based on said determined difference between said actual arrival time of said input data and said expected arrival time of said input data.

13. The circuit according to claim 12, wherein said first circuit further comprises:
    a register having a plurality of locations, said register for receiving and storing at least a portion of a predetermined data pattern;
    an encoder coupled to said register, said encoder having an input to receive data stored in at least a portion of said plurality of locations, said encoder providing an output representing a difference between an actual arrival time of said predetermined data pattern and an expected arrival time of said predetermined data pattern.

14. The circuit according to claim 13, wherein said encoder encodes said data stored in said at least a portion of said plurality of locations into a number, said number representing a location of said plurality of locations where a first bit of said predetermined data pattern is stored, said location where said first bit of said predetermined data is stored representing said difference between said actual arrival time of said predetermined data pattern and said expected arrival time of said predetermined data pattern.

15. The circuit according to claim 13, further comprising:
    a latch coupled to said encoder to receive and store said number.

16. The circuit according to claim 15, wherein said delay circuit further comprises:
    at least one counter coupled to said latch to receive said number, said at least one counter using said number as a starting point to count; and
    a detect circuit coupled to said at least one counter to determine when said at least one counter reaches a predetermined number during said count, said detect circuit providing an output signal to start said capture of said input data when said predetermined number has been reached.

17. The circuit according to claim 16, wherein said at least one counter includes first and second counters coupled to said latch, said first counter receiving said number and counting independently of said second counter.

18. The circuit according to claim 16, wherein said at least one counter is a down-counter and said predetermined number is zero.

19. The circuit according to claim 18, wherein said detect circuit includes at least one zero detect circuit.

20. The circuit according to claim 19, wherein said detect circuit includes at least one OR gate coupled to an output of each said at least one zero detect circuit.

21. The circuit according to claim 16, wherein said at least one counter includes at least one respective reset input to receive at least one respective reset signal to reset said at least one counter.

22. The circuit according to claim 16, further comprising:
a deserializer having a first input coupled to receive said output signal from said detect circuit and a second input coupled to receive said input data, wherein capture of said input data is delayed until said output signal from said detect circuit is received.

23. A memory device comprising:
a first circuit to determine a time difference between an actual arrival time of test data and an expected arrival time of said test data at said memory device, said time difference being measured by cycles of a clock signal; and
a delay circuit coupled to said first circuit, said delay circuit delaying a start time for capture of input data to said memory device based on said determined difference to align said start time for capture of said input data with an actual arrival time of said input data at said memory device.

24. The memory device according to claim 23, wherein said first circuit further comprises:
a register having a plurality of locations, said register for receiving and storing at least a portion of a test data;
an encoder coupled to said register, said encoder having an input to receive data stored in at least a portion of said plurality of locations, said encoder providing an output representing said difference between said actual arrival time of test data and said expected arrival time of said test data at said memory device.

25. The memory device according to claim 24, wherein said register has sixteen locations.

26. The memory device according to claim 25, wherein said at least a portion of said plurality of locations includes eight locations.

27. The memory device according to claim 26, wherein said eight locations are even locations of said register.

28. The memory device according to claim 26, wherein said eight locations are odd locations of said register.

29. The memory device according to claim 26, wherein said encoder encodes data stored in said eight locations into a number, said number representing a location of said plurality of locations where a first bit of said test data is stored, said location where said first bit of said test data is stored representing said difference between said actual arrival time of test data and said expected arrival time of said test data at said memory device.

30. The memory device according to claim 29, wherein said number is a binary number.

31. The memory device according to claim 29, further comprising:
a latch coupled to said encoder to receive and store said number.

32. The memory device according to claim 31, wherein said delay circuit further comprises:
at least one counter coupled to said latch to receive said number, said at least one counter using said number as a starting point to count; and
a detect circuit coupled to said at least one counter to determine when said at least one counter reaches a predetermined number during said count, said detect circuit providing an output signal to start said capture of said input data when said predetermined number has been reached.

33. The memory device according to claim 32, wherein said at least one counter includes first and second counters coupled to said latch, said first counter receiving said number and counting independently of said second counter.

34. The memory device according to claim 32, wherein said at least one counter is a down-counter and said predetermined number is zero.

35. The memory device according to claim 34, wherein said detect circuit includes at least one zero detect circuit.

36. The memory device according to claim 35, wherein said detect circuit includes at least one OR gate coupled to an output of each said at least one zero detect circuit.

37. The memory device according to claim 32, wherein said at least one counter includes at least one respective reset input to receive at least one respective reset signal to reset said at least one counter.

38. The memory device according to claim 32, further comprising:
a deserializer having a first input coupled to receive said output signal from said detect circuit and a second input coupled to receive said input data, wherein capture of said input data is delayed until said output signal from said detect circuit is received.

39. The memory device according to claim 24, wherein said test data is sixteen bits long.

40. The memory device according to claim 39, wherein said test data includes a first bit having a first value and all remaining bits having a second value.

41. A memory device comprising:
an input pad for receiving input data;
a deserializer having a first input coupled to said input pad; and
a delay circuit having an output coupled to a second input of said deserializer, said delay circuit providing an output signal to said deserializer, said deserializer in response to said output signal starting to capture said input data,
wherein said delay circuit delays said start time of said capture of said input data to align said start time with arrival of said input data at said memory device.

42. The memory device according to claim 41, wherein said delay circuit further comprises:
at least one counter having an input coupled to receive a predetermined number, said at least one counter using said number as a starting point to count; and
a detect circuit coupled to said at least one counter to determine when said at least one counter reaches a predetermined number during said count, said detect circuit providing said output signal to start said capture of said input data when said predetermined number has been reached.

43. The memory device according to claim 42, wherein said at least one counter includes first and second counters coupled to said latch, said first counter receiving said number and counting independently of said second counter.

44. The memory device according to claim 42, wherein said at least one counter is a down-counter and said predetermined number is zero.

45. A processor system comprising:
a processing unit; and
a memory device connected to said processing unit, said memory device comprising:
a first circuit to determine a difference between an actual arrival time of test data and an expected arrival time of said test data at said memory device; and
a delay circuit coupled to said first circuit, said delay circuit delaying a start time for capture of input data to said memory device based on said determined difference to align said start time for capture of said input data with an actual arrival time of said input data at said memory device.

46. The processor system according to claim 45, wherein said first circuit further comprises:
   a register having a plurality of locations, said register for receiving and storing at least a portion of a test data;
   an encoder coupled to said register, said encoder having an input to receive data stored in at least a portion of said plurality of locations, said encoder providing an output representing said difference between said actual arrival time of test data and said expected arrival time of said test data at said memory device.

47. The processor system according to claim 46, wherein said register has sixteen locations.

48. The processor system according to claim 47, wherein said portion of said plurality of locations includes eight locations.

49. The processor system according to claim 48, wherein said eight locations are even locations of said register.

50. The processor system according to claim 48, wherein said eight locations are odd locations of said register.

51. The processor system according to claim 48, wherein said encoder encodes data stored in said eight locations into a number, said number representing a location of said plurality of locations where a first bit of said test data is stored, said location where said first bit of said test data is stored representing said difference between said actual arrival time of test data and said expected arrival time of said test data at said memory device.

52. The processor system according to claim 51, wherein said number is a binary number.

53. The processor system according to claim 51, further comprising:
   a latch coupled to said encoder to receive and store said number.

54. The processor system according to claim 53, wherein said delay circuit further comprises:
   at least one counter coupled to said latch to receive said number, said at least one counter using said number as a starting point to count; and
   a detect circuit coupled to said at least one counter to determine when said at least one counter reaches a predetermined number during said count, said detect circuit providing an output signal to start said capture of said input data when said predetermined number has been reached.

55. The processor system according to claim 54, wherein said at least one counter includes first and second counters coupled to said latch, said first counter receiving said number and counting independently of said second counter.

56. The processor system according to claim 54, wherein said at least one counter is a down-counter and said predetermined number is zero.

57. The processor system according to claim 56, wherein said detect circuit includes at least one zero detect circuit.

58. The processor system according to claim 57, wherein said detect circuit includes at least one OR gate coupled to an output of each said at least one zero detect circuit.

59. The processor system according to claim 54, wherein said at least one counter includes at least one respective reset input to receive at least one respective reset signal to reset said at least one counter.

60. The processor system according to claim 54, wherein said memory device further comprises:
   a deserializer having a first input coupled to receive said output signal from said detect circuit and a second input coupled to receive said input data, wherein capture of said input data is delayed until said output signal from said detect circuit is received.

61. The processor system according to claim 45, wherein said processing unit and said memory device are on a same chip.

62. A processor system comprising:
   a processing unit; and
   a memory device connected to said processing unit, said memory device comprising:
      an input pad for receiving input data;
      a deserializer having a first input coupled to said input pad; and
      a delay circuit having an output coupled to a second input of said deserializer, said delay circuit providing an output signal to said deserializer, said deserializer in response to said output signal starting to capture said input data,
   wherein said delay circuit delays said start time of said capture of said input data to align said start time with arrival of said input data at said memory device.

63. The processor system according to claim 62, wherein said delay circuit further comprises:
   at least one counter having an input coupled to receive a predetermined number, said at least one counter using said number as a starting point to count; and
   a detect circuit coupled to said at least one counter to determine when said at least one counter reaches a predetermined number during said count, said detect circuit providing said output signal to start said capture of said input data when said predetermined number has been reached.

64. The processor system according to claim 63, wherein said at least one counter includes first and second counters coupled to said latch, said first counter receiving said number and counting independently of said second counter.

65. The processor system according to claim 63, wherein said at least one counter is a down-counter and said predetermined number is zero.

66. The processor system according to claim 62, wherein said processing unit and said memory device are on a same chip.

67. A method for writing input data to a memory device comprising the steps of:
   determining a difference between an actual receipt time of test data by said memory device and an expected receipt time of said test data by said memory device;
   receiving a write command to write said input data to said memory device; and
   delaying a start time of capture of said input data based on said determined difference to align said start time of capture with receipt of said input data.

68. The method according to claim 67, wherein said step of determining further comprises:
   sending a test data pattern to said memory device; and
   comparing an actual receipt time of said test data pattern to an expected receipt time of said test data pattern.

69. The method according to claim 68, wherein said step of comparing further comprises:
   storing said test data pattern in a register having a plurality of locations; and
   determining a location of said plurality of locations a first bit of said test data pattern is stored in, said location representing a difference with respect to a clock signal between said actual receipt time of said test data pattern and said expected receipt time of said test data pattern.

70. The method according to claim 69, wherein said step of determining further comprises:

determining a value based on said location; and storing said value.

71. The method according to claim 70, wherein said step of delaying further comprises:

counting to a predetermined value using said determined value as a starting value;

detecting when said predetermined value has been reached; and providing a signal to start capture of said input data when said predetermined value has been reached.

72. The method of claim 71, wherein said predetermined value is zero and said step of counting further comprises:

counting down from said determined value to zero.

73. A method for writing data to a memory device comprising the steps of:

sending a write command to said memory device;

sending said data to said memory device after waiting a specified amount of time, said specified amount of time based on a specified write latency of said memory device; and delaying a start of capture of said data a predetermined amount of time, said predetermined amount of time based on an actual write latency of said memory device, to align said start of capture of said data with receipt of said data by said memory device.

74. The method according to claim 73, wherein said step of delaying further comprises:

delaying said start of capture by a predetermined number of clock cycles.

* * * * *

UNITED STATES PATENT AND TRADEMARK OFFICE
CERTIFICATE OF CORRECTION

PATENT NO.     : 6,697,926 B2
DATED          : February 24, 2004
INVENTOR(S)    : Brian Johnson et al.

It is certified that error appears in the above-identified patent and that said Letters Patent is hereby corrected as shown below:

Column 7,
Lines 6 and 7, reads "110a, 110a" should read -- 110a, 110b --

Column 8,
Lines 17, 18 and 19, reads "110a, 110a" should read -- 110a, 110b --

Signed and Sealed this

Twenty-ninth Day of June, 2004

JON W. DUDAS
*Acting Director of the United States Patent and Trademark Office*